United States Patent
Nishimoto

[11] Patent Number: 5,886,292
[45] Date of Patent: Mar. 23, 1999

[54] THERMOELECTRIC MATERIAL

[75] Inventor: Seiji Nishimoto, Saitama, Japan

[73] Assignee: Honda Giken Kogyo Kabushiki Kaisha, Tokyo, Japan

[21] Appl. No.: 895,515

[22] Filed: Jul. 16, 1997

[30] Foreign Application Priority Data

Jul. 16, 1996 [JP] Japan .................................. 8-185866

[51] Int. Cl.$^6$ ........................... H01L 35/28; H01L 35/14; H01L 35/20; C04B 35/00
[52] U.S. Cl. ........................ 136/225; 136/227; 136/239; 136/240; 252/62.3 T
[58] Field of Search ............................... 136/236.1, 238, 136/239, 240, 224, 225, 227; 252/62.3 T

[56] References Cited

U.S. PATENT DOCUMENTS 5,436,467  7/1995  Elsner et al. ............................... 257/15

Primary Examiner—Kathryn Gorgos
Assistant Examiner—Thomas H Parsons
Attorney, Agent, or Firm—Lyon & Lyon LLP

[57] ABSTRACT

A thermoelectric material having excellent thermoelectric performance is shown and described. A thermoelectric material is formed having a plurality of conductive layers and a plurality of barrier layers that are alternatingly formed one upon the other such that one conductive layer is sandwiched by two barrier layers. The conductive layers are composed of a first semiconductor only, and the two barrier layers located on the outermost sides of the material each have a main layer made of a second semiconductor only and a boundary layer made of the first and second semiconductors. A plurality of barrier layers positioned in between the conductive layers each have a main layer and two boundary layers provided on opposite sides of the main layer. The thickness $t_1$ of the conductive layer and the thickness $t_2$ of the barrier layer have a relationship of $2t_1 \leq t_2 \leq 50t_1$.

4 Claims, 2 Drawing Sheets

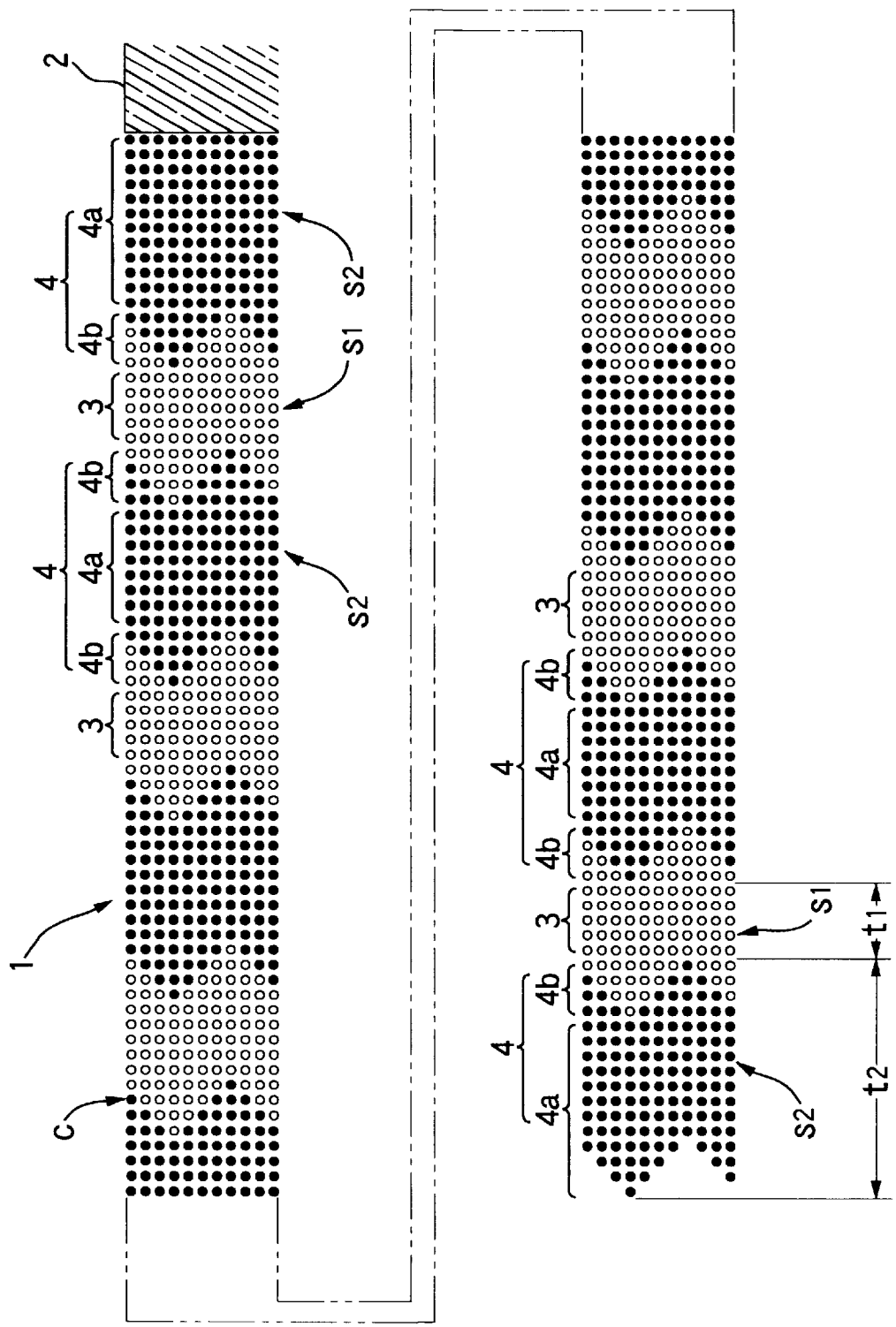

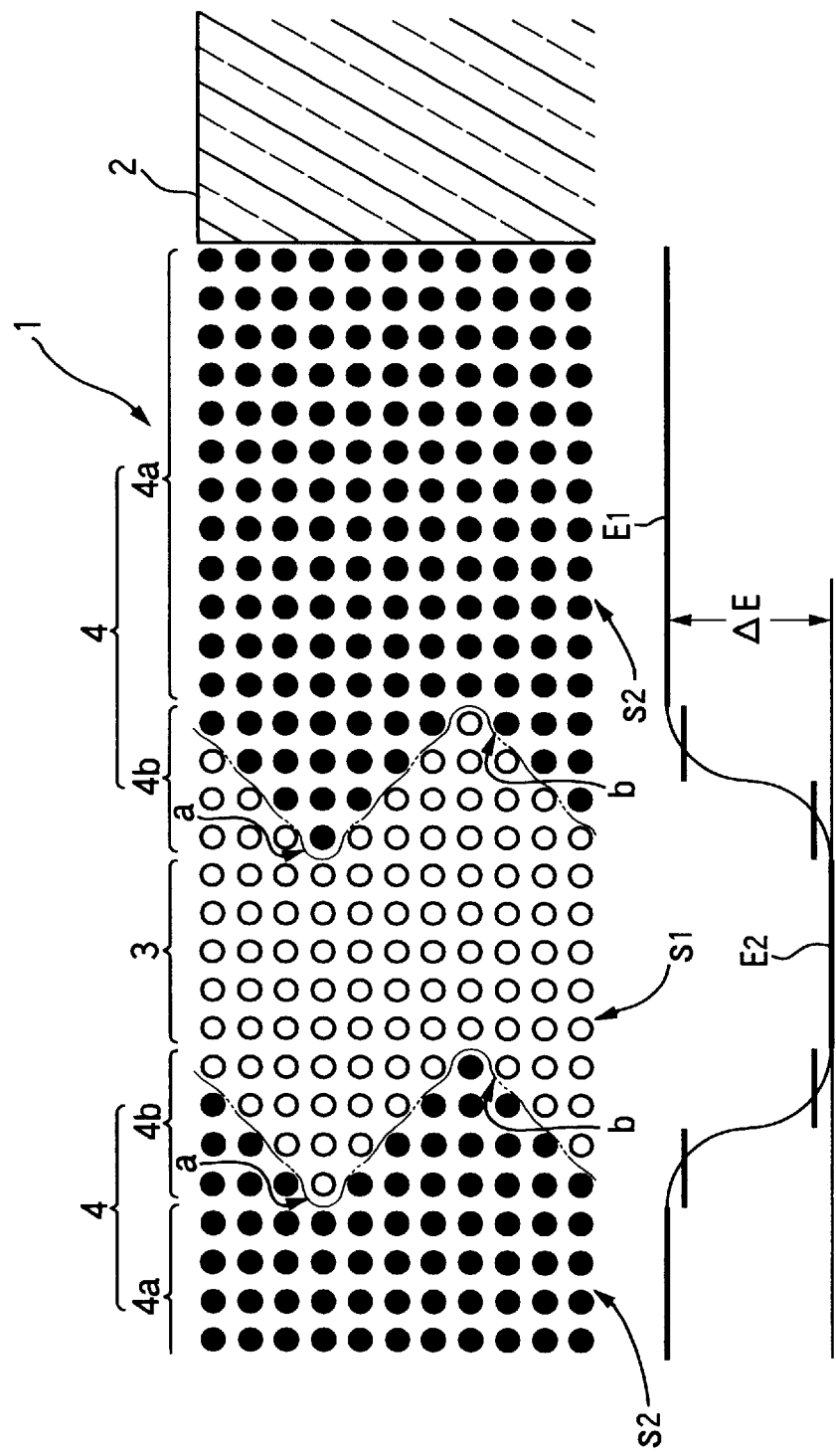

THERMOELECTRIC MATERIAL

FIELD OF THE INVENTION

The present invention relates to thermoelectric materials.

BACKGROUND OF THE INVENTION

There has heretofore been known thermoelectric materials of a type which comprise conductive layers and barrier layers in the form of very thin films having the same thickness (see, for example, U.S. Pat. No. 5,436,467).

In the thermoelectric material, the energy gap in the barrier layer is maintained to be much wider than the energy gap in the conductive layer to create a large difference between the two energy gaps, whereby quantum wells are formed in the conductive layers. As a result, the electric conductivity of the thermoelectric material is heightened, and an improved thermoelectric performance is exhibited.

Here, if a first semiconductor of the conductive layer and a second semiconductor of the barrier layer are mixed together in a boundary region between the barrier layer and the conductive layer at the step of forming the layers, the effect of the mixing readily appears on the barrier layer which is in the form of a very thin film. As a result, the energy gap is narrowed in the barrier layer, and the difference between the two energy gaps so decreases that no quantum well is formed in the conductive layer.

In order to strictly control the interface between the barrier layer and the conductive layer, therefore, the layers have heretofore been formed by a molecular beam epitaxial method (MBE), an atomic epitaxial layer method (ALE) or the like method.

However, currently available methods for controlling the interface between the barrier layer and the conductive layer have numerous shortcomings. For example, the above-mentioned methods require very expensive equipment and very complex process control. In addition, despite the control of the steps, the occurrence rate of defective products is high, resulting in an increase in the cost at which the thermoelectric materials are produced.

A need therefore exists for a thermoelectric material which has an excellent thermoelectric performance, and which increases the productivity and reduces the cost of production. The present invention fulfills these needs, and provides further related advantages.

SUMMARY OF THE INVENTION

Briefly, the present invention provides a thermoelectric material that has excellent thermoelectric performance, and that is simple and cost effective to manufacture. In a preferred embodiment, a thermoelectric material is provided with a plurality of conductive layers and a plurality of barrier layers that are alternatingly formed one upon the other, such that one conductive layer is sandwiched by two barrier layers.

The conductive layers are made of a first semiconductor only. The two barrier layers located on the outermost sides of the material each have a main layer made of a second semiconductor only, that is different from the first semiconductor, and a boundary layer which is located on one side of the main layer adjacent to the conductive layer, that is made of the first and second semiconductors. A plurality of barrier layers positioned in between conductive layers each have a similar main layer and two similar boundary layers located on opposite sides of the main layer and adjacent to the conductive layers. In a preferred embodiment of the present invention, the thickness $t_1$ of the conductive layer and the thickness $t_2$ of the barrier layer have a relationship of $2t_1 \leq t_2 \leq 50t_1$, and more preferably, $2t_1 \leq t_2 \leq 20t_1$.

The layers of the thermoelectric material are formed by sputtering which is a generally employed method of forming thin films. The barrier layer has a boundary layer due to the sputtering, the thickness of the boundary layer being about twenty and several percent of the thickness $t_2$ of the barrier layer at the maximum.

In order to suppress the effect of the boundary layers on the main layer in the barrier layer, the thickness $t_2$ of the barrier layer is set as $2t_1 \leq t_2 \leq 50t_1$, with respect to the thickness $t_1$ of the conductive layer. This configuration makes it possible to maintain a sufficiently broad energy gap in the main layer to increase the difference between the energy gaps in the main layer and the energy gap in the conductive layer to form quantum wells in the conductive layers. As a result, the electric conductivity is increased and the thermoelectric performance of the thermoelectric material is enhanced.

Moreover, the layers are formed by a generally employed method of forming thin layers, making it possible to produce a thermoelectric material having good productivity, in accordance with the present invention, while decreasing the cost of production.

BRIEF DESCRIPTION OF THE DRAWINGS

FIG. 1 is a diagram illustrating a thermoelectric material provided in accordance with a preferred embodiment of the present invention.

FIG. 2 is a diagram illustrating the relationship among the barrier layer, conductive layer and energy gaps of the material of FIG. 1.

DETAILED DESCRIPTION OF THE INVENTION

As illustrated in FIG. 1, a thermoelectric material 1 is formed on a substrate 2. More particularly, a plurality of conductive layers 3 and a plurality of barrier layers 4 are alternatingly formed one upon the other such that each conductive layer 3 is sandwiched between two barrier layers 4.

Each conductive layer 3 is made of a first semiconductor $s_1$ only. The two barrier layers 4 located on the outermost sides of the material 1 comprise a main layer 4a composed of a second semiconductor $s_2$ only, that is different from the first semiconductor $s_1$, and a boundary layer 4b composed of the first and second semiconductors $s_1$ and $s_2$, which is located on one side of the main layer 4a and is adjacent to the conductive layer 3. A plurality of barrier layers 4 positioned in between conductive layers 3 each have a similar main layer 4a and two similar boundary layers 4b located on opposite sides of the main layer 4a and adjacent to two conductive layers 3. In a preferred embodiment, the material is formed such that thickness $t_1$ of the conductive layers 3 and the thickness $t_2$ of the barrier layers 4 have a relationship of $2t_1 \leq t_2 \leq 50t_1$, and more preferably, $2t_1 \leq t_2 \leq 20t_1$.

The layers of the thermoelectric material 1 are formed by sputtering which is a generally employed method of forming thin films.

Referring to FIG. 2, when a first layer of the second semiconductor $s_2$ is formed on the substrate 2 by sputtering, a plurality of protuberances (a) made of the second semiconductor $s_2$ and a plurality of recesses (b) depressed below the surface, where no second semiconductor $s_2$ exists, are formed in the surface of the first layer due to uneven growth of crystals and surface diffusion in the initial stage of forming the first layer.

Then, when a layer of the first semiconductor $s_1$ is formed on the surface of the first layer, the protuberances (a) are covered with the first semiconductor $s_1$ and the recesses (b) are filled with the first semiconductor $s_1$ thereby forming a second layer. In the surface of the second layer are formed a plurality of protuberances (a) made of the first semiconductor $s_1$ and a plurality of recesses (b) depressed below the surface, where no first semiconductor $s_1$ exists, in the same manner as described above.

Moreover, when a layer of the second semiconductor $s_2$ is formed on the surface of the second layer, the protuberances (a) of the first semiconductor $s_1$ are covered with the second semiconductor $s_2$ and the recesses (b) are filled with the second semiconductor $s_2$ thereby forming a third layer. In the material illustrated in FIG. 1, formed in the surface of the third layer are a plurality of protuberances (a) composed of the second semiconductor $s_2$ and a plurality of recesses (b) depressed below the surface, where no second semiconductor $s_2$ exists, in the same manner as described above.

The above-mentioned steps of forming layers are repeated and, lastly, a layer made of the second semiconductor $s_2$ is formed.

In the thermoelectric material 1 produced through the above-mentioned process for forming layers, the region made of the first semiconductor $s_1$ only is the conductive layer 3, the region made of the second semiconductor $s_2$ only is the main layer 4a in the barrier layer 4, and the region made of the first and second semiconductors $s_1$ and $s_2$ is the boundary layer 4b in the barrier layer 4. In the material illustrated in FIG. 1, the thickness of the main layers 4a in both barrier layers 4 located on the outermost sides of the material is greater than the thickness of the main layers 4a in the barrier layers 4 located in between conductive layers 3.

Due to the sputtering as described above, the barrier layer 4 has a boundary layer 4b. However, the thickness of the boundary layer 4b is about twenty and several percent of the thickness $t_2$ of the barrier layer 4 at the maximum.

In order to suppress the effect of the boundary layers 4b upon the main layers 4a, the thickness $t_2$ of the barrier layer 4 is set as $2t_1 \leq t_2 \leq 50t_1$ with respect to the thickness $t_1$ of the conductive layer 3. This configuration makes it possible to maintain a sufficiently broad energy gap $E_1$ in the main layers 4a to increase the difference $\Delta E$ between the energy gap $E_1$ in the main layers 4a and the energy gap $E_2$ in the conductive layers 3, to form quantum wells in the conductive layers 3. As a result, the electric conductivity is increased and the thermoelectric performance of the thermoelectric material 1 is enhanced.

When the thickness $t_2$ of the barrier layer is $t_2 \leq 2t_1$, the main layer is greatly affected by the two boundary layers in the barrier layers, deteriorating the thermoelectric performance of the thermoelectric material. When $t_2 \leq 50t_1$, on the other hand, the number of quantum wells per unit volume in the thermoelectric material decreases, and the thermoelectric performance of the thermoelectric material deteriorates.

Although a variety of materials may be used, examples of preferred materials for the substrate 2, and the first and second semiconductors $s_1$, $s_2$ are given below. Namely, the substrate 2 can be glass for semiconductor substrates, a silicon wafer, a ceramic wafer or a polymer film.

Examples of the first semiconductor $s_1$, of which the conductive layers 3 are made, include p-type semiconductors such as $Fe_{0.9}Mn_{0.1}Si_2$ [$FeSi_2$ semiconductor], $(Si_{0.8}Ge_{0.2})B_{0.003}$[SiGe semiconductor], $(PbTe_{0.95}Se_{0.05})Na_{0.01}$[PbTe semiconductor], and $(GeTe)_{0.85}(AgSbTe_2)_{0.15}$ [PbTe substituted semiconductor], n-type semiconductors such as $Fe_{0.9}Co_{0.1}Si_2$ [$FeSi_2$ semiconductor], $(Si_{0.8}Ge_{0.2})P_{0.0002}$ [SiGe semiconductor], $(Pb_{0.95}Ge_{0.05}Te)(PbI_2)_{0.001}$ [PbTe semiconductor], and p-type and n-type BiTe semiconductors.

Examples of the second semiconductor $s_2$, of which the barrier layers 4 are made, include Si, $FeSi_2$ [$FeSi_2$ semiconductor], $Si_{0.8}Ge_{0.2}$ [SiGe semiconductor] and $(Pb_{0.9}Eu_{0.07})$ Te [PbTe semiconductor].

In carrying out the sputtering, the inside of the chamber is evacuated to about $10^{-3}$ Torr, and is replaced with an argon gas. After the flow rate of argon gas is adjusted, the electric discharge is started. During the discharge, the flow rate of argon gas is set at 5 to 25 SCCM (SCCM: mass flow rate), the electric power for sputtering is set at 50 to 500 watts, and the sputtering rate is set at 10 to 300 Å/second. In accordance with the present invention, the conductive layers 3 and the barrier layers 4 are controlled to have predetermined thicknesses according to the sputtering rate and the sputtering time.

An Example will now be described.

Table 1 shows the manufacturing conditions under which a thermoelectric material is produced, and under which Examples 1 to 4 were produced to form the conductive layers 3 and the barrier layers 4 by changing their respective thicknesses $t_1$ and $t_2$ over a range of $2t_1 \leq t_2 \leq 50t_1$.

TABLE 1

| | | |
|---|---|---|
| Substrate | glass for semiconductor substrate, substrate temp.: room temp. | |
| Conditions inside the chamber | Pressure: $5 \times 10^{-3}$ Torr, argon gas atmosphere | |
| Discharging conditions | argon gas flow rate: 15 SCCM, sputtering power: 100 watts, sputtering rate: 10 Å/sec. | |

| | Material | Number of Layers |
|---|---|---|
| Conducting layer | $(Si_{0.8}Ge_{0.2})B_{0.003}$ | 100 |
| Barrier layer | | |
| Main layer | Si | 101 |
| Boundary layer | $(Si_{0.8}Ge_{0.2})B_{0.003}$ + Si | |

For comparison, Comparative Examples 1 to 3 were produced under the same production conditions as those of Table 1 except that the relationship of the thicknesses of the conductive layers and the barrier layers is out of the above-mentioned range. By using a powder of $(Si_{0.8}Ge_{0.2})B_{0.0003}$, furthermore, Comparative Example 4 was produced by powder metallurgy.

In Examples 1 to 4 and Comparative Examples 1 to 4, furthermore, the thermoelectric outputs and the electric conductivities were measured by the methods described below.

Electrodes were attached to both film-forming surfaces c (FIG. 1 shows only one of the Examples 1 to 4 and the Comparative Examples 1 to 4. The electrode of the one side was heated at 300° C. by using an infrared ray heater, the temperature of the electrode of the other side was held at room temperature to create a temperature gradient, and the thermoelectric power generated across the two electrodes were measured. The temperatures of the two electrodes were controlled by using thermocouples. The electric conductivity was measured based on a known four-terminal method.

TABLE 2 shows the results of measurement.

| | Thickness Å | | | Electric |
| | Conductive Layer | Barrier layer | Thermoelectric Output (W) | Conductivity σ (S/m) |
|---|---|---|---|---|
| Example | | | | |
| 1 | 50 | 100 | 7.8 | 39000 |
| 2 | 50 | 500 | 8.3 | 38000 |
| 3 | 50 | 1000 | 8 | 39000 |
| 4 | 50 | 2500 | 2 | 18000 |
| Comparative Example | | | | |
| 1 | 50 | 50 | 0.3 | 10000 |
| 2 | 50 | 70 | 0.5 | 12000 |
| 3 | 50 | 3000 | 0.6 | 10000 |
| 4 | — | — | 0.8 | 10000 |

As will be obvious from Table 2 above, the Examples 1 to 4 exhibit superior thermoelectric performances to the Comparative Examples 1 to 4. This is because, in the Examples 1 to 4, the respective thicknesses $t_1$ and $t_2$ of the conductive layers 3 and the barrier layers 4 were set to have a relationship $2t_1 \leq t_2 \leq 50t_1$. Preferably, the thicknesses $t_1$ and $t_2$ have a relationship $2t_1 \leq t_2 \leq 20t_1$.

A thermoelectric material which exhibits an excellent thermoelectric performance and can be produced at a low cost has been shown and described. From the foregoing, it will be appreciated that although embodiments of the invention have been described herein for purposes of illustration, various modifications may be made without deviating from the spirit of the invention. Thus, the present invention is not limited to the embodiments described herein, but rather is defined by the claims which follow.

I claim:

1. A thermoelectric material comprising:

a plurality of conductive layers and a plurality of barrier layers that are alternatingly formed one upon the other such that each conductive layer is positioned between two barrier layers, and wherein the thickness $t_1$ of each of the conductive layers and the thickness $t_2$ of each of the barrier layers have a relationship of $2t_1 \leq t_2 \leq 50t_1$.

2. The thermoelectric material according to claim 1 wherein the conductive layers are made of a first semiconductor only, and the barrier layers have a main layer made of a second semiconductor only, that is different from the first semiconductor, and the barrier layers have a boundary layer positioned adjacent to the main layer and to each adjacent conductive layer, the boundary layers being made of the first and second semiconductors.

3. The thermoelectric material according to claim 2 wherein the first semiconductor is selected from a group including $FeSi_2$ semiconductor, SiGe semiconductor, PbTe semiconductor and BiTe semiconductor, and the second semiconductor is selected from a group including Si, $FeSi_2$ semiconductor, SiGe semiconductor and PbTe semiconductor.

4. A thermoelectric material comprising:

a plurality of conductive layers and a plurality of barrier layers alternatingly formed on a substrate such that each conductive layer is positioned between two barrier layers, the conductive layers being made of a first semiconductor only, a first barrier layer positioned adjacent the substrate and a last barrier layer located at the most distal side of the material from the substrate each having a main layer made of a second semiconductor only, the second semiconductor being different from the first semiconductor, and having a boundary layer located on one side of the main layer adjacent to one of the conductive layers, the boundary layer being made of the first and the second semiconductors, the plurality of barrier layers being positioned between two conductive layers each having a main layer and two boundary layers positioned on opposite sides of the main layer adjacent to conductive layers, and wherein the thickness $t_1$ of each of the conductive layers and the thickness $t_2$ of each of the barrier layers have a relationship of $2t_1 \leq t_2 \leq 50t_1$.

* * * * *

UNITED STATES PATENT AND TRADEMARK OFFICE
CERTIFICATE OF CORRECTION

PATENT NO. : 5,886,292
DATED : March 23, 1999
INVENTOR(S) : Seiji Nishimoto et al.

It is certified that error appears in the above-identified patent and that said Letters Patent is hereby corrected as shown below:

Column 4, line 8, please change "$P_{0.0002}$" to -- $P_{0.002}$ --.

Column 4, line 53, please change "$B_{0.0003}$" to -- $B_{0.003}$ --.

Column 4, line 61, after "only one" insert -- film-forming surface) --.

Column 5, line 3, insert -- Table 2 shows the results of measurement. --.

Column 5, Table 2, delete the words "shows the results of measurement.".

Signed and Sealed this

Twenty-ninth Day of February, 2000

Attest:

Attesting Officer

Q. TODD DICKINSON

Commissioner of Patents and Trademarks